(12) United States Patent
Koo et al.

(10) Patent No.: US 8,113,918 B2
(45) Date of Patent: Feb. 14, 2012

(54) SUBSTRATE SUPPORTING UNIT AND SINGLE TYPE SUBSTRATE POLISHING APPARATUS USING THE SAME

(75) Inventors: Gyo-Woog Koo, Chungcheongnam-do (KR); Chang-Ro Yoon, Gyeonggi-do (KR); Jung-Gun Cho, Seoul (KR); Ki-Hoon Choi, Chungcheongnam-do (KR); Jung-Bong Choi, Seoul (KR); Duk-Hyun Son, Daejeon (KR); Se-Hun Goo, Jeollanam-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 390 days.

(21) Appl. No.: 12/273,829

(22) Filed: Nov. 19, 2008

(65) Prior Publication Data

US 2009/0325469 A1 Dec. 31, 2009

(51) Int. Cl.
*B24B 5/02* (2006.01)
(52) U.S. Cl. ............................ 451/67; 451/289; 451/388
(58) Field of Classification Search .............. 279/3, 126, 279/128; 451/8, 9, 10, 11, 54, 65, 67, 289, 451/388, 398, 402
See application file for complete search history.

(56) References Cited

U.S. PATENT DOCUMENTS

| | | | | |
|---|---|---|---|---|
| 5,938,512 A * | 8/1999 | Takei et al. | | 451/388 |
| 5,964,646 A * | 10/1999 | Kassir et al. | | 451/41 |
| 6,127,125 A * | 10/2000 | Yurino et al. | | 435/6 |
| 6,966,822 B2 * | 11/2005 | Kajiwara et al. | | 451/41 |
| 7,406,759 B2 * | 8/2008 | Yamamoto et al. | | 29/559 |
| 2004/0206304 A1 * | 10/2004 | Menear | | 118/500 |
| 2008/0052948 A1 * | 3/2008 | Kim et al. | | 34/317 |
| 2008/0061519 A1 * | 3/2008 | Cho et al. | | 279/106 |
| 2008/0127888 A1 * | 6/2008 | Kim et al. | | 118/52 |
| 2010/0130105 A1 * | 5/2010 | Lee | | 451/41 |

FOREIGN PATENT DOCUMENTS

| | | |
|---|---|---|
| JP | 61-038863 | 2/1986 |
| JP | 08-203977 | 8/1996 |
| JP | 10-303110 | 11/1998 |
| JP | 11-054394 | 2/1999 |
| JP | 2000-294622 | 10/2000 |
| JP | 2002-208560 | 7/2002 |
| KR | 1020070009781 A | 1/2007 |
| WO | 2008/048518 | 4/2008 |

* cited by examiner

*Primary Examiner* — Timothy V Eley
(74) *Attorney, Agent, or Firm* — Carter, DeLuca, Farrell & Schmidt LLP

(57) ABSTRACT

Provided are a substrate supporting unit and a single type substrate polishing apparatus using the substrate supporting unit. During a polishing process, the bottom surface of a substrate is attached to the substrate supporting unit by vacuum suction, and during a post-cleaning process, the substrate is supported by the substrate supporting unit at a position spaced apart from the substrate supporting unit for cleaning the bottom surface of the substrate. Therefore, according to the substrate supporting unit and the substrate polishing apparatus using the substrate supporting unit, in a state where the substrate is supported by the single type substrate supporting unit, a process for polishing the top surface of the substrate and a post-process for cleaning the top and bottom surfaces of the substrate can be sequentially performed.

27 Claims, 16 Drawing Sheets

SUBSTRATE SUPPORTING UNIT AND SINGLE TYPE SUBSTRATE POLISHING APPARATUS USING THE SAME

CROSS-REFERENCE TO RELATED APPLICATIONS

This U.S. non-provisional patent application claims priority under 35 U.S.C. §119 of Korean Patent Application No. 10-2008-0062444, filed on Jun. 30, 2008, the entire contents of which are hereby incorporated by reference.

BACKGROUND OF THE INVENTION

The present invention disclosed herein relates to a semiconductor manufacturing apparatus and method, and more particularly, to a substrate supporting unit for supporting a semiconductor substrate by a single substrate processing method and a substrate polishing apparatus for polishing and cleaning a substrate using the substrate supporting unit.

In a general semiconductor device manufacturing process, a plurality of processes such as a deposition process, a photo process, and an etching process are repeatedly performed to form and stack thin films on a wafer. Such processes are repeated until a desired circuit pattern is formed on the wafer, and the surface of the wafer becomes uneven after the circuit pattern is formed. Recent highly-integrated semiconductor devices have a multi-layer structure, many surface bends, and increased height differences between the surface bends. Since troubles, such as defocusing in a photo process, are caused by an uneven surface of a wafer, the uneven surface of the wafer should be periodically polished for planarizing the uneven surface of the wafer.

Various surface planarization techniques have been developed for planarizing the surface of a wafer, and a chemical mechanical polishing (CMP) technique is widely used among such planarization techniques because wide surfaces as well as narrow surfaces can be planarized with good flatness by using the CMP technique. A CMP apparatus is used to polish the surface of a wafer coated with tungsten or an oxide by using mechanical friction and chemical abrasives, and fine polishing is possible using the CMP apparatus.

SUMMARY OF THE INVENTION

The present invention provides a substrate supporting unit and a single type substrate polishing apparatus using the substrate supporting unit such that polishing and post-cleaning processes can be sequentially performed on a substrate by a single substrate processing method in which substrates are processed one after another.

Objects of the present invention are not limited to those mentioned above, and other objects of the present invention will be apparently understood by those skilled in the art through the following description.

Embodiments of the present invention provide substrate supporting units including: a vacuum plate to which a substrate is attached by vacuum suction; a supporting plate disposed under the vacuum plate at a predetermined distance from the vacuum plate, and at which chucking members are disposed to clamp the substrate; and a driving member configured to move the vacuum plate or the supporting plate upward and downward so as to allow the chucking members to support the substrate in a state where the substrate is spaced upwardly from the supporting plate.

In some embodiments, the driving member may include: upper and lower magnet members vertically arranged under the supporting plate to face each other, the upper and lower magnet members being oriented with opposing poles thereof facing each other such that a magnetic repulsive force acts between the upper and lower magnet members; connection members having ends connected to the vacuum plate and the other ends connected to the upper magnet member; and a linear driving unit configured to move the lower magnet member upward and downward.

In other embodiments, poles of each of the upper and lower magnet members may be arranged in a ring shape.

In still other embodiments, the connection members may have a bar shape and be inserted in holes formed through the supporting plate.

In even other embodiments, the substrate supporting unit may further include an elastic member configured to exert an elastic repulsive force between the supporting plate and the upper magnet member.

In yet other embodiments, the substrate supporting unit may further include a sensing member configured to detect whether the lower magnet member is vertically moved to a preset height.

In further embodiments, the chucking members may include: supporting pins configured to support a bottom surface of the substrate; and chucking pins configured to support an edge of the substrate, wherein holes are formed through the vacuum plate for receiving the supporting pins and the chucking pins when the supporting plate is moved upward and downward.

In even further embodiments, a detachment preventing jaw may protrude from an edge portion of the vacuum plate to prevent detachment of the substrate attached to the vacuum plate by vacuum suction.

In yet further embodiments, a buffer member formed of an elastic material may be disposed on a top surface of the vacuum plate to prevent the substrate attached to the vacuum plate by vacuum suction from being deformed by a foreign substance existing between the substrate and the vacuum plate.

In some embodiments, the driving member may include: an upper magnet member disposed at the supporting plate; a lower magnet member disposed under the upper magnet member to face the upper magnet member, poles of the lower magnet member being oriented such that a magnetic repulsive force acts between the upper and lower magnet members; and a linear driving unit configured to move the lower magnet member upward and downward.

In other embodiments, the chucking members may include: supporting pins configured to support a bottom surface of the substrate; and L-shaped chucking rods rotatably disposed outside the supporting pins for supporting an edge of the substrate, wherein holes are formed through the vacuum plate for receiving the supporting pins when the supporting plate is moved upward and downward.

In still other embodiments, a pressing member may protrude from a bottom surface of the vacuum plate, and when the supporting plate is moved upward, the pressing member may press horizontal parts of the L-shaped chucking rods to rotate the chucking rods such that vertical parts of the rotated chucking rods may support the edge of the substrate.

In even other embodiments, the substrate supporting unit may further include a guide member disposed at a rotation shaft connected to a bottom surface of the vacuum plate for guiding upward and downward movements of the supporting plate.

In yet other embodiments, the substrate supporting unit may further include an elastic member configured to exert an elastic repulsive force between the vacuum plate and the supporting plate.

In other embodiments of the present invention, single type substrate polishing apparatuses include: a process chamber; a substrate supporting unit disposed in the process chamber for supporting a substrate; a polishing unit configured to polish the substrate; and a cleaning unit configured to clean the polished substrate, wherein the substrate supporting unit includes: a vacuum plate to which the substrate is attached by vacuum suction; a supporting plate disposed under the vacuum plate at a predetermined distance from the vacuum plate, and at which chucking members are disposed to clamp the substrate; and a driving member configured to move the vacuum plate or the supporting plate upward and downward so as to allow the chucking members to support the substrate in a state where the substrate is spaced upwardly from the supporting plate.

In some embodiments, the driving member may include: upper and lower magnet members vertically arranged under the supporting plate to face each other, the upper and lower magnet members being oriented with opposing poles thereof facing each other such that a magnetic repulsive force acts between the upper and lower magnet members; connection members having ends connected to the vacuum plate and the other ends connected to the upper magnet member; and a linear driving unit configured to move the lower magnet member upward and downward.

In other embodiments, the chucking members may include: supporting pins configured to support a bottom surface of the substrate; and chucking pins configured to support an edge of the substrate, wherein holes are formed through the vacuum plate for receiving the supporting pins and the chucking pins when the supporting plate is moved upward and downward.

In still other embodiments, the connection members may have a bar shape and be inserted in holes formed through the supporting plate, and coil shaped elastic members may be disposed around the bar-shaped connection members between the supporting plate and the upper magnet member.

In even other embodiments, the single type substrate polishing apparatus may further include a sensing member configured to detect whether the lower magnet member is vertically moved to a preset height.

In yet other embodiments, a detachment preventing jaw may protrude from an edge portion of the vacuum plate to prevent detachment of the substrate attached to the vacuum plate by vacuum suction, and a buffer member formed of an elastic material may be disposed on a top surface of the vacuum plate to prevent the substrate attached to the vacuum plate by vacuum suction from being deformed by a foreign substance existing between the substrate and the vacuum plate.

In further embodiments, the cleaning unit may include: a first cleaning unit disposed at a side of the substrate supporting unit for cleaning a top surface of the substrate; and a second cleaning unit disposed at a top center portion of the supporting plate for supplying a cleaning liquid to a bottom surface of the substrate, wherein an opening is formed through a center portion of the vacuum plate to allow supply of the cleaning liquid from the second cleaning unit to the bottom surface of the substrate.

In still further embodiments, the driving member may include: an upper magnet member disposed at the supporting plate; a lower magnet member disposed under the upper magnet member to face the upper magnet member, poles of the lower magnet member being oriented such that a magnetic repulsive force acts between the upper and lower magnet members; and a linear driving unit configured to move the lower magnet member upward and downward.

In even further embodiments, the chucking members may include: supporting pins configured to support a bottom surface of the substrate; and L-shaped chucking rods rotatably disposed outside the supporting pins for supporting an edge of the substrate, wherein holes are formed through the vacuum plate for receiving the supporting pins when the supporting plate is moved upward and downward.

In yet further embodiments, a pressing member may protrude from a bottom surface of the vacuum plate, and when the supporting plate is moved upward, the pressing member may press horizontal parts of the L-shaped chucking rods to rotate the chucking rods such that vertical parts of the rotated chucking rods may support the edge of the substrate.

In some embodiments, the single type substrate polishing apparatus may further include a guide member disposed at a rotation shaft supporting the vacuum plate for guiding upward and downward movements of the supporting plate.

In other embodiments, the single type substrate polishing apparatus may further include an elastic member configured to exert an elastic repulsive force between the vacuum plate and the supporting plate.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1:
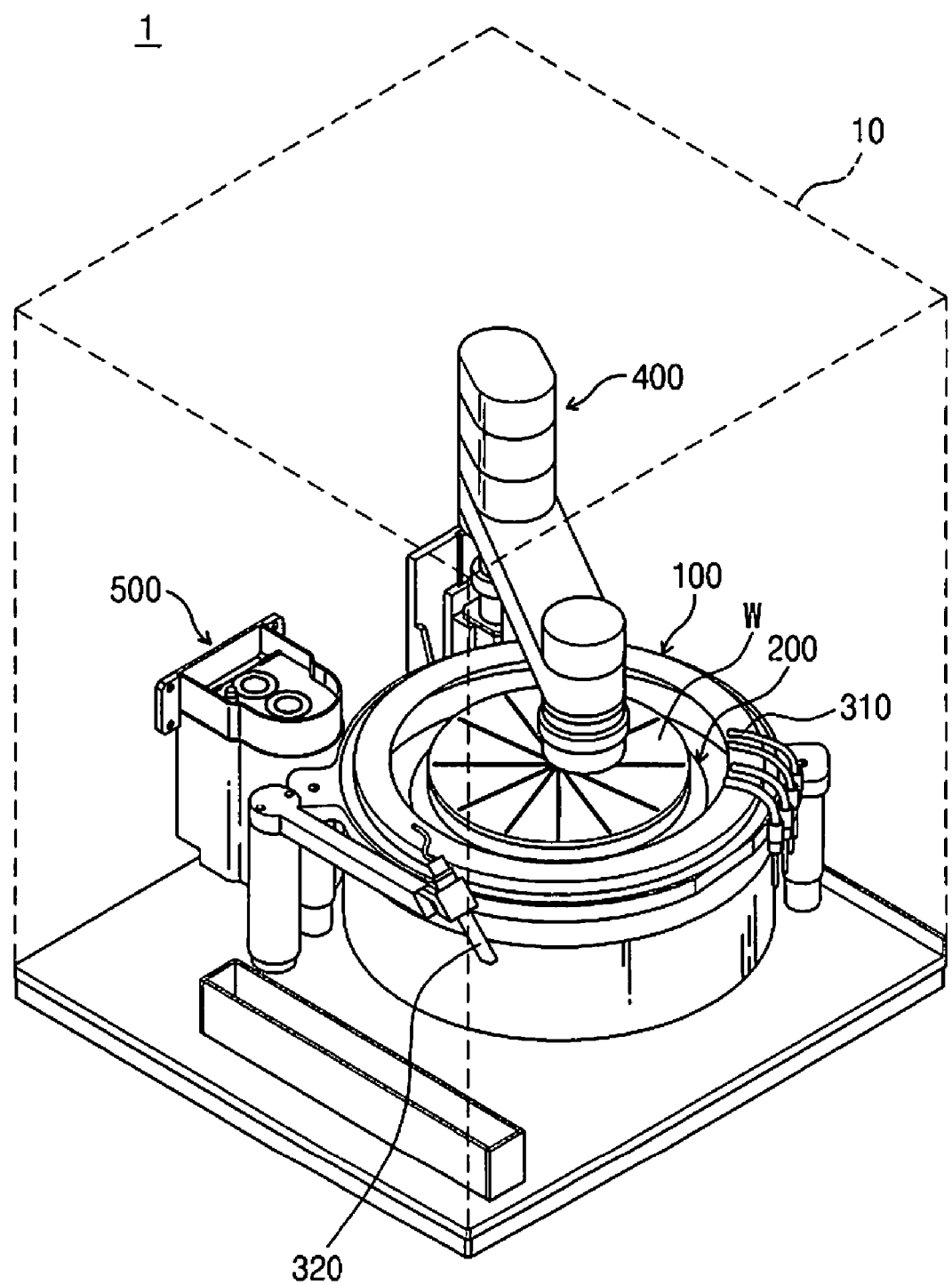
FIG. 1 is a perspective view illustrating a single type substrate polishing apparatus according to an embodiment of the present invention.

A substrate supporting unit and a single type substrate polishing apparatus using the substrate supporting unit will now be described below in more detail with reference to the accompanying drawings, in which exemplary embodiments of the invention are shown. In the figures, elements are indicated by reference numerals, and the same or similar elements may be indicated by the same reference numerals. In the following descriptions, well-known structures and functions will not be described in detail to avoid ambiguous interpretation of the present invention.

Embodiment

Figure 2:
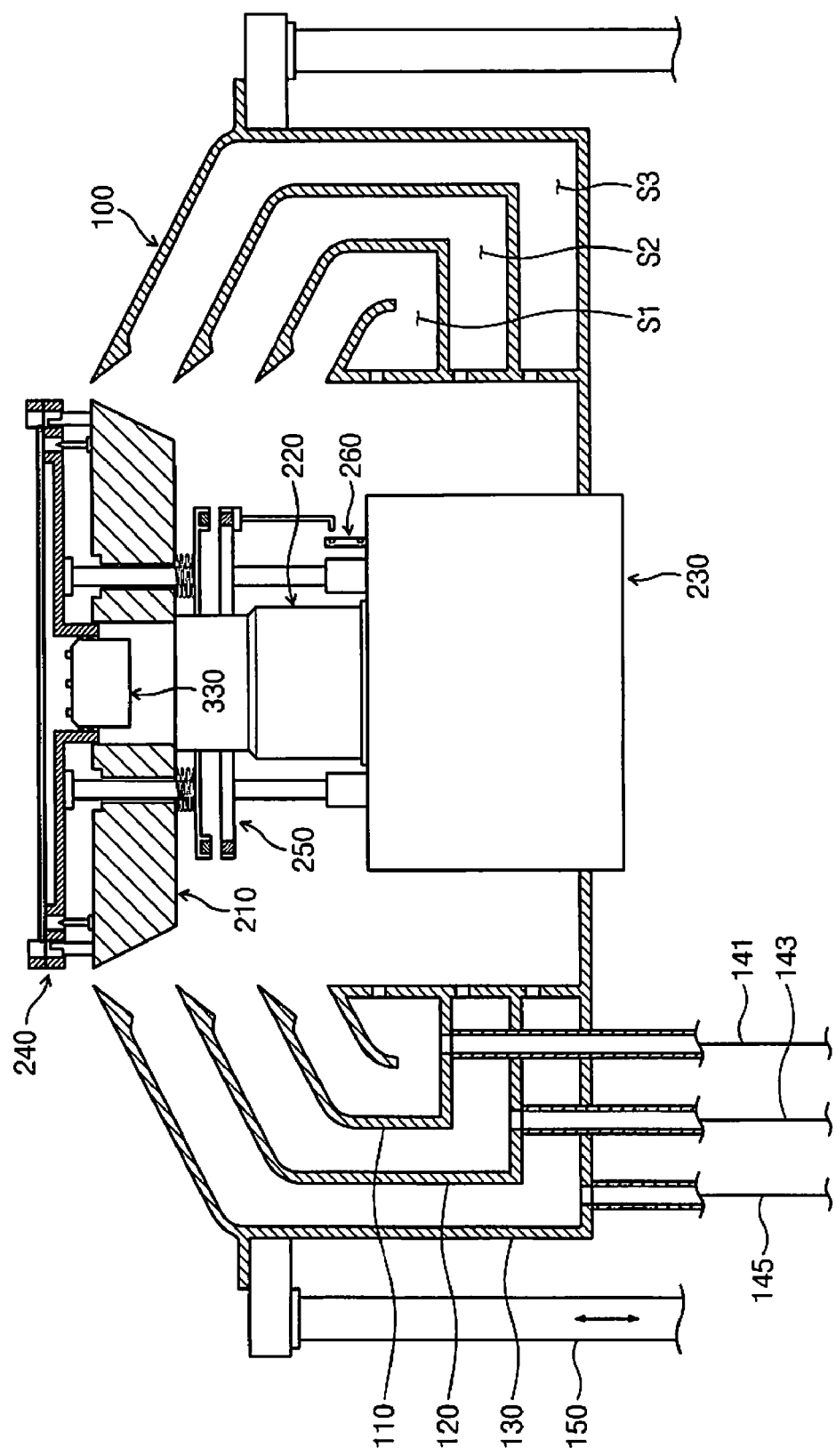
FIG. 2 is a side sectional view illustrating a process vessel and a substrate supporting unit of FIG. 1.

FIG. 1 is a perspective view illustrating a single type substrate polishing apparatus 1 according to an embodiment of the present invention, and FIG. 2 is a side sectional view illustrating a process vessel 100 and a substrate supporting unit 200 of the single type substrate polishing apparatus 1 depicted in FIG. 1.

The single type substrate polishing apparatus 1 of the current embodiment may be used for sequentially performing a polishing process on the top surface of a substrate W and a cleaning process on the top and bottom surfaces of the substrate W in the same process chamber 10.

Referring to FIGS. 1 and 2, the single type substrate polishing apparatus 1 of the current embodiment includes the process vessel 100, the substrate supporting unit 200, cleaning units 310, 320, and 330, a polishing unit 400, and a pad conditioning unit 500. The process vessel 100 provides a space in which a substrate W can be processed. The substrate supporting unit 200 is disposed inside the process vessel 100, and during substrate polishing and post-cleaning processes, the substrate supporting unit 200 fixes a substrate W loaded into the process vessel 100. The cleaning units 310 and 320 are disposed at predetermined sides of the process vessel 100 for cleaning the top surface of a substrate W, and the cleaning unit 330 is disposed at the substrate supporting unit 200 for cleaning the bottom surface of the substrate W. After a substrate W is polished by the polishing unit 400, the substrate W is cleaned by the cleaning units 310, 320, and 330. The cleaning unit 310 is a cleaning liquid supply member configured to supply a cleaning liquid to the top surface of a substrate W, and the cleaning unit 320 is a supersonic cleaning member configured to apply supersonic waves to the cleaning liquid supplied to the top surface of the substrate W so as to increase the cleaning efficiency of the substrate W. The cleaning unit 330 is a cleaning liquid supply member configured to supply a cleaning liquid to the bottom surface of a substrate W. The polishing unit 400 and the pad conditioning unit 500 are disposed at other sides of the process vessel 100. The polishing unit 400 is used to polish the top surface of a substrate W chemically and mechanically, and the pad conditioning unit 500 is used to polish a polishing pad (not shown) of the polishing unit 400 to adjust the surface roughness of the polishing pad.

The process vessel 100 includes a first collecting barrel 110, a second collecting barrel 120, and a third collecting barrel 130, which have a cylindrical shape. In the current embodiment, the process vessel 100 includes three collecting barrels; however, the number of collecting barrels can be increased or decreased. The first, second, and third collecting barrels 110, 120, and 130 are used to collect cleaning liquid supplied to a substrate W during a substrate processing process. In the substrate polishing apparatus 1, a substrate W is cleaned while being rotated by the substrate supporting unit 200. Thus, cleaning liquid supplied to the substrate W can be scattered from the substrate W. The first, second, and third collecting barrels 110, 120, and 130 are used to collect the scattered cleaning liquid.

The first, second, and third collecting barrels 110, 120, and 130 form first, second, and third collecting spaces S1, S2, and S3 to which cleaning liquid scattered from a substrate W is introduced. The first collecting barrel 110 forms the first collected space S1 to collect a first collecting liquid used to process a substrate W first. The second collecting space S2 is formed between the first and second collecting barrels 110 and 120 to collect a second cleaning liquid used to process the substrate W secondly. The third collecting space S3 is formed between the second and third collecting barrels 120 and 130 to collect a third cleaning liquid used to process the substrate W thirdly.

The first collecting barrel 110 is connected to a first collecting line 141. The first cleaning liquid collected in the first collected space S1 is discharged to the outside through the first collecting line 141. The second collecting barrel 120 is connected to a second collecting line 143. The second cleaning liquid collected in the second collecting space S2 is discharged to the outside through the second collecting line 143. The third collecting barrel 130 is connected to a third collecting line 145. The third cleaning liquid collected in the third collecting space S3 is discharged through the third collecting line 145.

A vertical mover 150 may be coupled to the process vessel 100 to change the vertical position of the process vessel 100. The vertical mover 150 is disposed at an outer wall of the third collecting barrel 130 to move the process vessel 100 upward and downward while the vertical position of the substrate supporting unit 200 is fixed. Therefore, the relative vertical positions of the process vessel 100 and the substrate W can be changed. Accordingly, different cleaning liquids can be collected in the collecting spaces S1, S2, and S3 of the process vessel 100.

Figure 3:
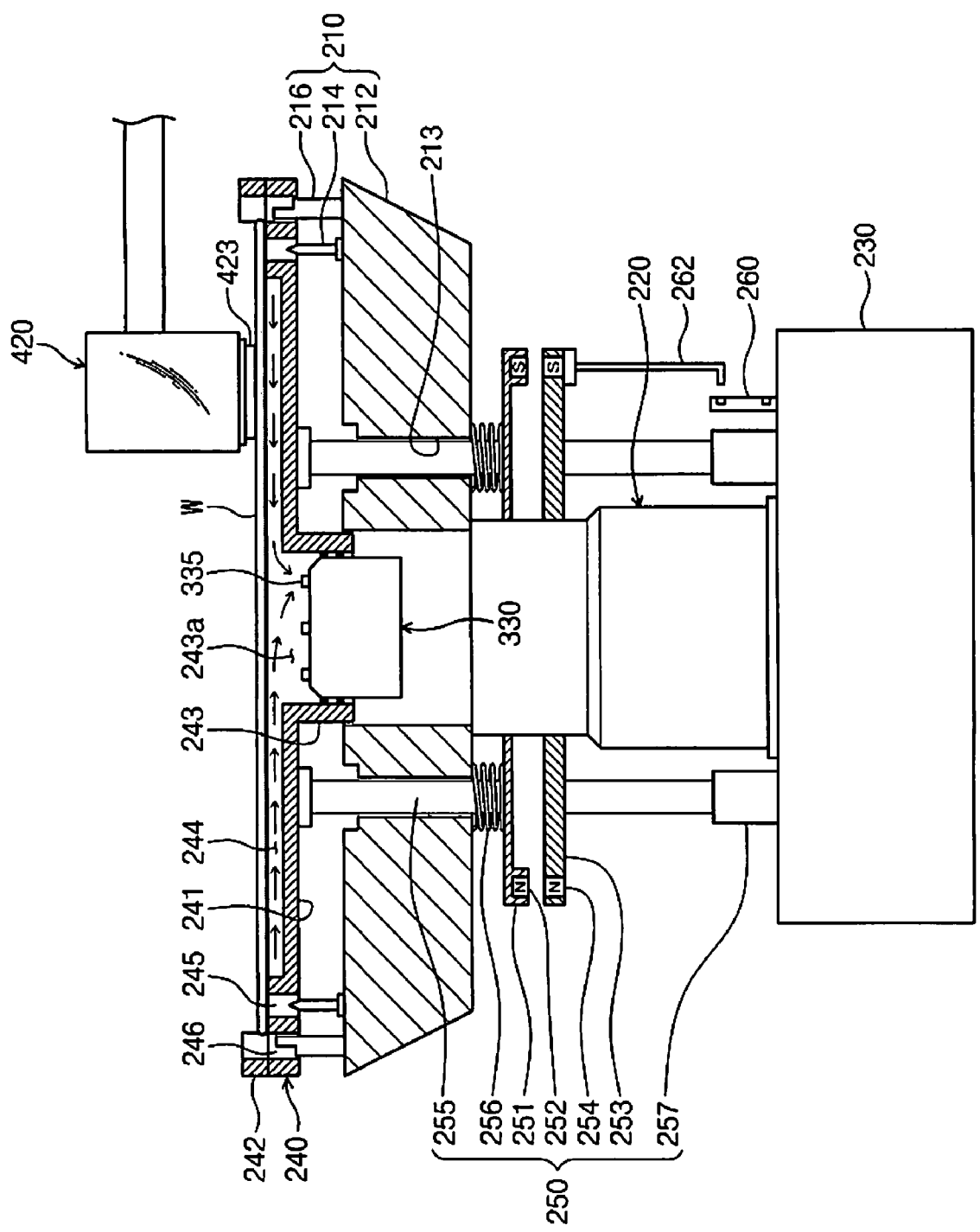
FIG. 3 is a view for illustrating a process of polishing a substrate using the substrate supporting unit according to an embodiment of the present invention.
Figure 4:
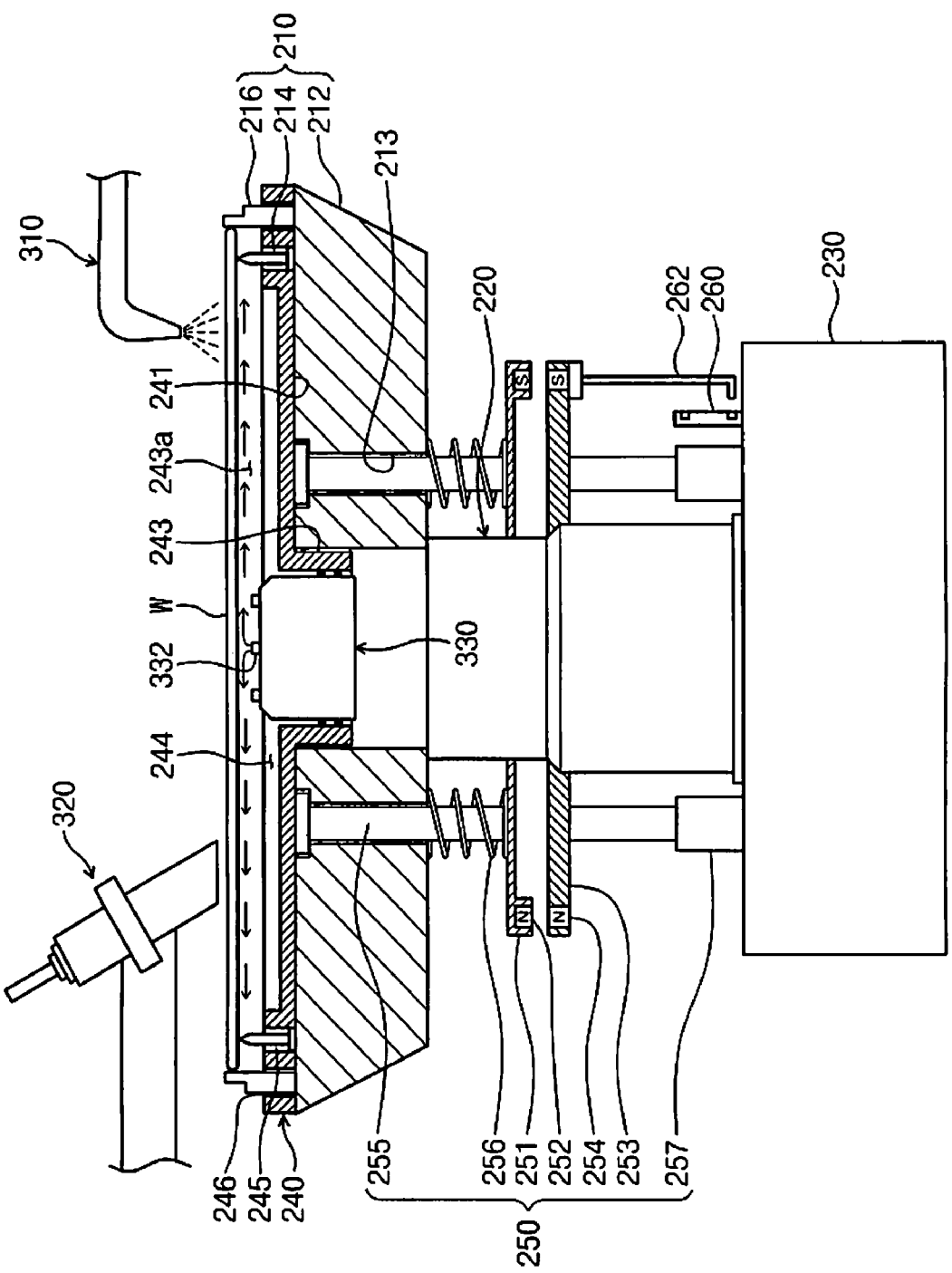
FIG. 4 is a view for illustrating a process of cleaning a substrate using the substrate supporting unit according to an embodiment of the present invention.

FIG. 3 is a view for illustrating a process of polishing a substrate W using the substrate supporting unit 200 according to an embodiment of the present invention, and FIG. 4 is a view for illustrating a process of cleaning a substrate W using the substrate supporting unit 200 according to an embodiment of the present invention.

Referring to FIGS. 2, 3, and 4, the substrate supporting unit 200 includes a supporting plate 210, a rotation shaft 220, a rotation driving unit 230, a vacuum plate 240, and a driving member 250. The substrate supporting unit 200 is disposed inside the process vessel 100 so that a substrate W can be supported and rotated while being processed. The vacuum plate 240 supports a substrate W during a polishing process as shown in FIG. 3, and the supporting plate 210 supports the substrate W during a post-cleaning process as shown in FIG. 4. The driving member 250 moves the vacuum plate 240 upward so that the vacuum plate 240 can support a substrate W during a polishing process, and the driving member 250 moves the vacuum plate 240 downward so that the supporting plate 210 can support the substrate W during a post-cleaning process. The rotation shaft 220 is connected to the bottom side of the supporting plate 210, and the rotation driving unit 230 is connected to the bottom side of the rotation shaft 220 to rotate the rotation shaft 220. The rotation driving unit 230 may be a motor.

Chucking members 214 and 216 are disposed at the top surface of the supporting plate 210 for clamping a substrate W. The chucking members 214 and 216 include supporting pins 214 and chucking pins 216. The supporting pins 214 are arranged on the top surface of the supporting plate 210 in a predetermined pattern so as to support the bottom surface of a substrate W. The chucking pins 216 are arranged on the top surface of the supporting plate 210 outside the supporting pins 214 so as to support the edge of the substrate W.

Figure 5:
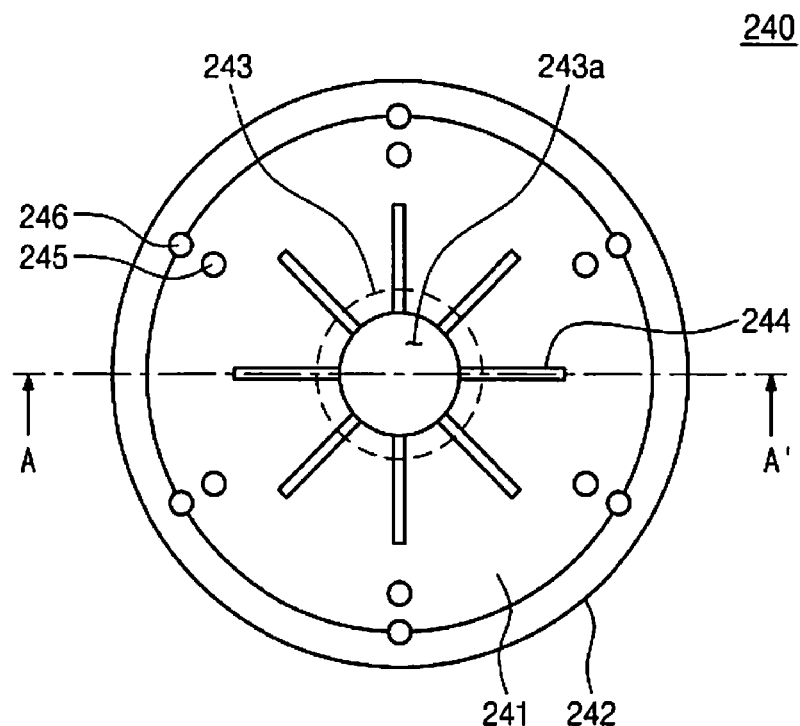
FIG. 5 is a plan view illustrating a vacuum plate of FIG. 3.
Figure 6:
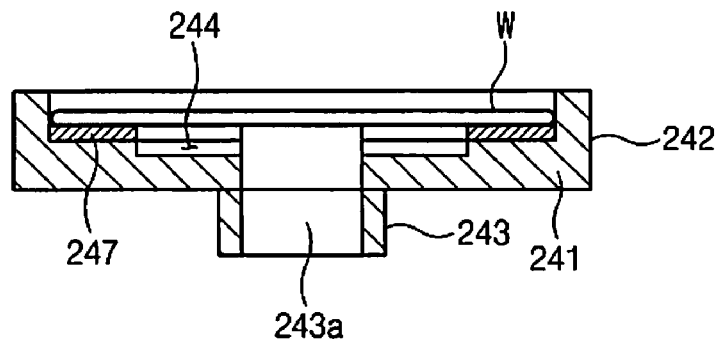
FIG. 6 is a sectional view taken along line A-A' of FIG. 5.

The vacuum plate 240 is disposed above the supporting plate 210 at a predetermined distance from the supporting plate 210 and is vertically moved by the driving member 250 (described later in more detail). As shown in FIGS. 5 and 6, the vacuum plate 240 includes a disk-shaped lower wall 241 and a sidewall 242 extending upward from the edge of the lower wall 241. Holes 245 and 246 are formed through the lower wall 241 and the sidewall 242. The holes 245 and 246 are formed at positions corresponding to the positions of the supporting pins 214 and chucking pins 216 of the supporting plate 210, so that the supporting pins 214 and the chucking pins 216 of the supporting plate 210 are inserted in the holes 245 and 246 when the vacuum plate 240 is vertically moved. An opening 243a is formed through the center portion of the lower wall 241, and another sidewall 243 extends downward from a peripheral portion of the opening 243a. Grooves 244 are formed in the top surface of the lower wall 241 in radial directions from the opening 243a. The grooves 244 communicate with the opening 243a.

A substrate W is placed on the top surface of the lower wall 241 of the vacuum plate 240, and a negative pressure is formed in the grooves 244 to stick the substrate W to the vacuum plate 240 (vacuum attachment). At this time, the sidewall 242 of the vacuum plate 240 prevents detachment of the substrate W from the vacuum plate 240, and the sidewall 242 may also be referred to as a detachment preventing jaw in clams.

A buffer member 247 formed of an elastic material is disposed on the top surface of the lower wall 241 of the vacuum plate 240. The buffer member 247 may be formed of an elastic material such as silicon or fluorine rubber. If foreign substances such as particles exist between the lower wall 241 of the vacuum plate 240 and a substrate W vacuum-attached to the lower wall 241, the flatness of the substrate W can be deteriorated due to deformation by the foreign substances. If a polishing process is performed on a substrate W having deteriorated flatness, the substrate W cannot be uniformly polished due to height differences on the surface of the substrate W. The buffer member 247 is provided to solve this situation. That is, although foreign substances exist between the substrate W and the vacuum plate 240 and a pressure is applied to the substrate W during a polishing process, the flatness of the substrate W can be uniformly maintained during the polishing process because the foreign substances go into the buffer member 247 formed of an elastic material.

A back nozzle assembly 330 is disposed at the center portion of the supporting plate 210, and the sidewall 243 of the vacuum plate 240 is inserted in a gap between the back nozzle assembly 330 and the supporting plate 210. The sidewall 243 is vertically movable in the gap.

Figure 7:
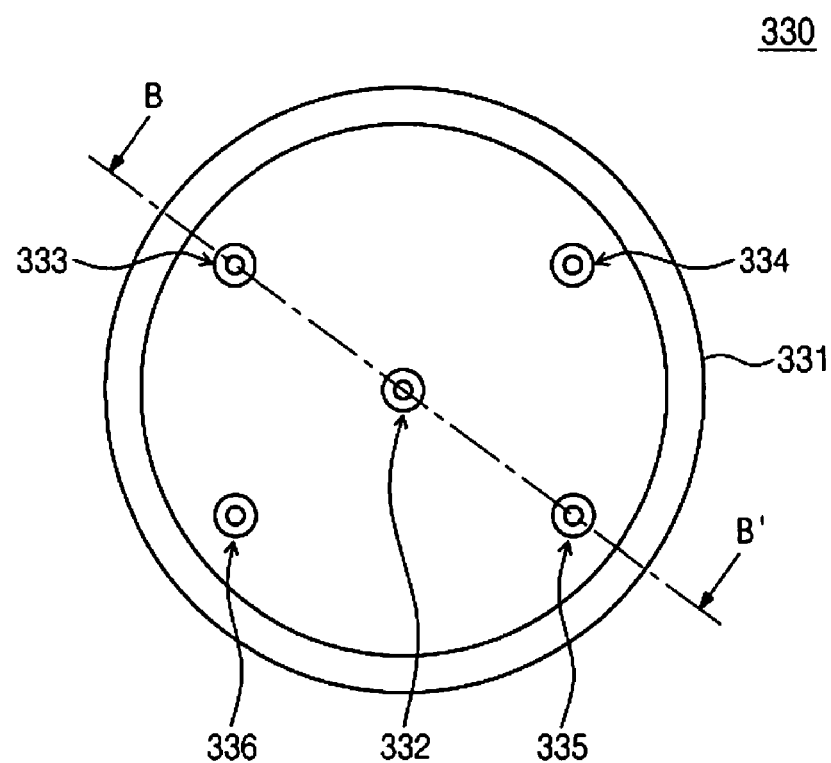
FIG. 7 is a plan view illustrating a back nozzle assembly of FIG. 3.
Figure 8:
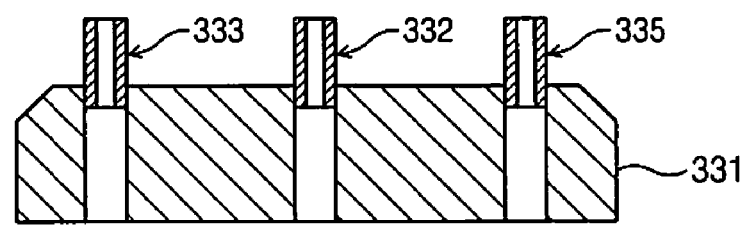
FIG. 8 is a sectional view taken along line B-B' of FIG. 7.

The back nozzle assembly 330 is used to supply cleaning liquid to the bottom surface of a substrate W or apply a negative pressure to the substrate W for sticking the substrate W. The back nozzle assembly 330 includes a nozzle body 331 (refer to FIG. 7) protruding from the top surface of the supporting plate 210. As shown in FIG. 7, cleaning liquid supply members 332 and 333, a rinsing liquid supply member 334, a dry gas supply member 336, and an exhaust member 335 are disposed at the nozzle body 331. The cleaning liquid supply members 332 and 333 are used to inject cleaning liquid to the bottom surface of a substrate W; the rinsing liquid supply member 334 is used to inject rinsing liquid to the bottom surface of the substrate W; and the dry gas supply member 336 is used to inject dry gas to the bottom surface of the substrate W. The exhaust member 335 is used to suck air from the bottom side of the substrate W to form a negative pressure for vacuum attachment of the substrate W. As shown in FIG. 8, the cleaning liquid supply members 332 and 333, the rinsing liquid supply member 334, the dry gas supply member 336, and the exhaust member 335 may be tube-shaped nozzles inserted in the nozzle body 331.

The driving member 250 moves the vacuum plate 240 upward so that the vacuum plate 240 can support a substrate W during a polishing process as shown in FIG. 3, and the driving member 250 moves the vacuum plate 240 downward so that the supporting plate 210 can support the substrate W during a post-cleaning process as shown in FIG. 4.

The driving member 250 includes an upper magnet member 251, a lower magnet member 253, connection members 255, and linear driving units 257. The upper and lower magnet members 251 and 253 have a ring shape and are vertically arranged under the supporting plate 210 to surround the rotation shaft 220. Magnets 252 and 254 are disposed at the upper and lower magnet members 251 and 253, respectively. Poles of the magnets 252 and 254 are oriented to form a magnetic repelling force between the magnets 252 and 254.

The connection members 255 have a bar shape and are inserted in vertical holes 213 formed through the supporting plate 210. Ends of the connection members 255 are connected to the lower wall 241 of the vacuum plate 240, and the other ends of the connection members 255 are connected to the upper magnet member 251. The linear driving units 257 are connected to the lower magnet member 253 to move the lower magnet member 253 linearly in upward and downward directions.

In the above-described structure, when the linear driving units 257 move the lower magnet member 253 upward, the upper magnet member 251 receiving a magnetic repulsive force from the lower magnet member 253 is moved upward, and thus the vacuum plate 240 connected to the upper magnet member 251 through the connection members 255 is moved upward. In this state, a substrate W is loaded on the vacuum plate 240, and a negative pressure is formed at the bottom side of the substrate W by the exhaust member 335 of the back nozzle assembly 330 so that the substrate W can be vacuum-attached to the vacuum plate 240. Thereafter, a polishing head 420 (described later) is moved toward the top side of the substrate W, and a polishing process is performed using a polishing pad 423 mounted on the polishing head 420.

After the polishing process, a post-cleaning process is performed on the top and bottom surfaces of the substrate W. For this, the linear driving units 257 move the lower magnet member 253 downward. Then, the upper magnet member 251 is moved downward by elastic repulsive forces exerted by elastic members 256 disposed between the supporting plate 210 and the upper magnet member 251, and thus the vacuum plate 240 connected to the upper magnet member 251 through the connection members 255 is moved downward. As the vacuum plate 240 is moved downward, the substrate W is supported by the chucking members 214 and 216 of the supporting plate 210. In this state, the cleaning unit 310 supplies cleaning liquid to the top surface of the substrate W, and the cleaning unit 320 applies supersonic waves to the cleaning liquid supplied to the top surface of the substrate W, so as to clean the top surface of the substrate W. At the same time, the cleaning liquid supply member 332 of the back nozzle assembly 330 supplies cleaning liquid to the bottom surface of the substrate W to clean the bottom surface of the substrate W.

According to an embodiment of the present invention, a sensing member 260 may be provided in the single type substrate polishing apparatus 1 to detect whether the lower magnet member 253 is vertically moved to a preset height in a polishing process or cleaning process. Various sensors such as an optical sensor may be used as the sensing member 260. The sensing member 260 may be disposed at a height corresponding to the upper position of the lower magnet member 253 and a height corresponding to the lower position of the lower magnet member 253. A rod 262 having a bent shape may be disposed at the bottom side of the lower magnet member 253. When the lower magnet member 253 is moved upward or downward, an end of the rod 262 is placed at a position corresponding to the upper or lower position of the lower magnet member 253 so that it can be determined whether the lower magnet member 253 is moved upward or downward by detecting the position of the end of the rod 262 using the sensing member 260.

In the above description, the supporting plate 210 of the substrate supporting unit 200 is fixed, and the vacuum plate 240 of the substrate supporting unit 200 is vertically moved; however, in other embodiments, a supporting plate may be vertically moved, and a vacuum plate may be fixed.

Figure 9:
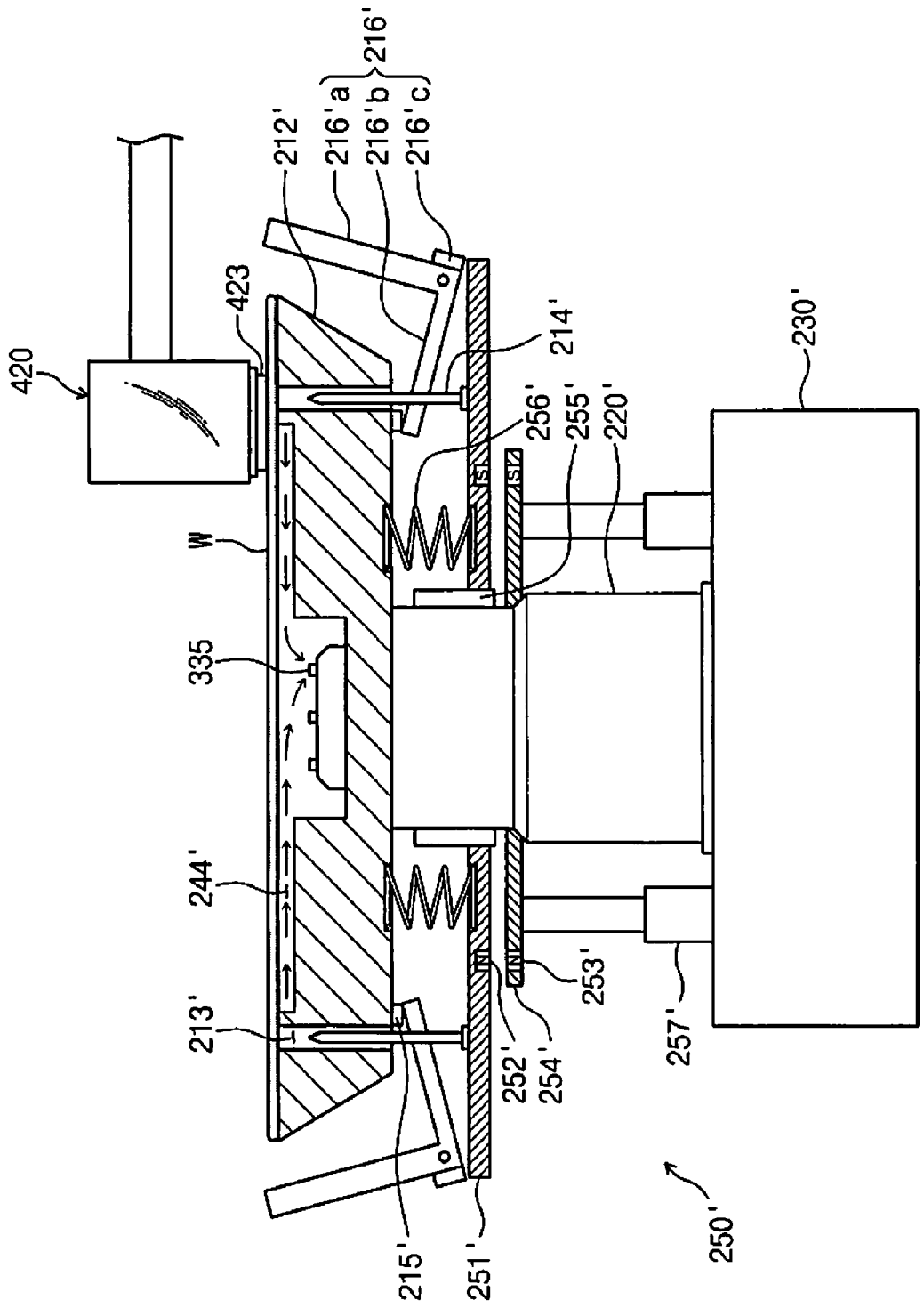
FIG. 9 is a view for illustrating a process of polishing a substrate using a substrate supporting unit according to another embodiment of the present invention.
Figure 10:
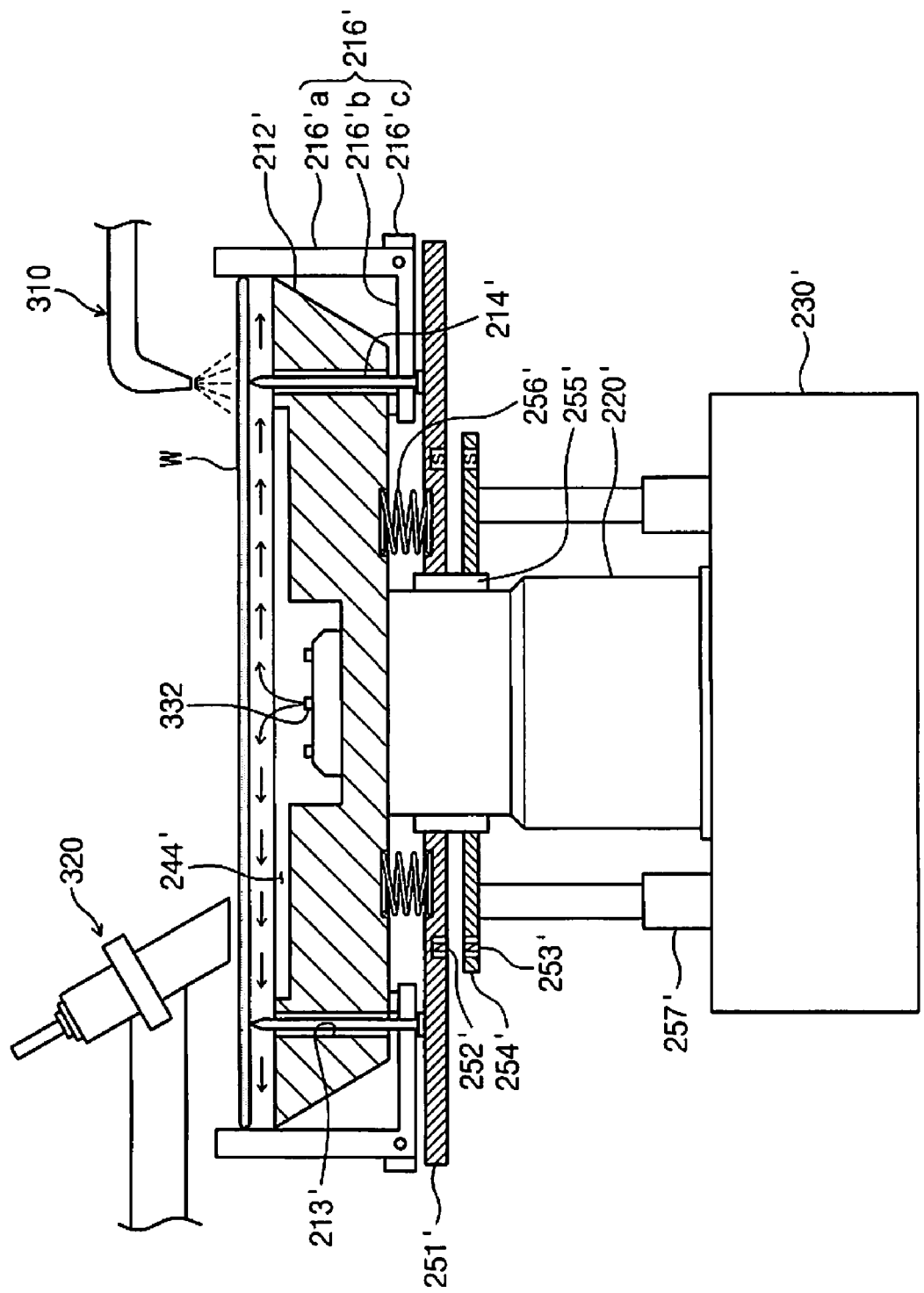
FIG. 10 is a view for illustrating a process of cleaning a substrate using a substrate supporting unit according to another embodiment of the present invention.

FIG. 9 is a view for illustrating a process of polishing a substrate using a substrate supporting unit 200 according to another embodiment of the present invention, and FIG. 10 is a view for illustrating a process of cleaning a substrate using the substrate supporting unit 200 according to another embodiment of the present invention.

Referring to FIGS. 9 and 10, the substrate supporting unit 200 includes a vacuum plate 212', a rotation shaft 220', a rotation driving unit 230, a supporting plate 251', and a driving member 250'. The vacuum plate 212' supports a substrate W during a polishing process as shown in FIG. 9, and the supporting plate 251' supports the substrate W during a post-cleaning process as shown in FIG. 10. The driving member 250' moves the supporting plate 251' downward so that the vacuum plate 212' can support a substrate W during a polishing process, and the driving member moves the supporting plate 251' upward so that so that the supporting plate 251' can support the substrate W during a post-cleaning process.

The vacuum plate 212' has a disk shape. A back nozzle assembly is disposed at the center portion of the vacuum plate 212', and grooves 244' are formed in the top surface of the vacuum plate 212' for vacuum attachment of a substrate W. An exhaust member 335 of the back nozzle assembly 330 is used to suck air from a space between the grooves 244' and the bottom surface of a substrate W to form a negative pressure for vacuum attachment of the substrate W. Holes 213' are formed through the vacuum plate 212' for receiving supporting pins 214' (described later) of the supporting plate 251'. The rotation shaft 220' is connected to the bottom side of the vacuum plate 212', and the rotation driving unit 230' is connected to the bottom side of the rotation shaft 220' to rotate the rotation shaft 220'. The rotation driving unit 230' may be a motor.

The supporting plate 251' is disposed under the vacuum plate 212' at a predetermined distance from the vacuum plate 212'. Chucking members 214' and 216' are disposed at the top surface of the supporting plate 251' for clamping a substrate W. The chucking members 214' and the 216' include the supporting pins 214' and chucking rods 216'. The supporting pins 214' are arranged in a predetermined pattern on the top surface of the supporting plate 251' and inserted in the holes 213' formed through the vacuum plate 212'. The chucking rods 216' may be L-shaped rods including vertical parts 216'a and horizontal parts 216'b. The chucking rods 216' are rotatably hinged outside the supporting pins 214'. Counter weights 216'c are disposed on sides of the vertical parts 216'a opposite to the horizontal parts 216'b. Owing to the counter weights 216'c, the vertical parts 216a of the chucking rods 216' tend to rotate to their outwardly inclined original positions. Pressing members 215' protrude from the bottom surface of the vacuum plate 212' so that when the supporting plate 251' is moved upward and downward, the horizontal parts 216'b of the chucking rods 216' can be pressed by the pressing members 215'. When the supporting plate 251' is moved upward, the pressing members 215' press the horizontal parts 216'b of the chucking rods 216' to rotate the vertical parts 216'a of the chucking rods 216' inwardly so that the edge of a substrate W can be supported by the vertical parts 216'b of the chucking rods 216'. At this time, the supporting pins 214' support the bottom surface of the substrate W.

A guide member 255' such as a linear motion (LM) guide is disposed at the rotation shaft 220' connected to the vacuum plate 212'. The guide member 255' is connected to the supporting plate 251' to guide vertical movements of the supporting plate 251'. Elastic members 256' are disposed between the vacuum plate 212' and the supporting plate 251' to apply repulsive forces to the vacuum plate 212' and the supporting plate 251'.

The driving member includes an upper magnet 252' disposed at the supporting plate 251' and a lower magnet 253' facing the upper magnet 252'. The upper magnet 252' and the lower magnet 253' are oriented with opposing poles facing each other so as to form a magnetic repulsive force between the upper and lower magnets 252' and 253'. The lower magnet 253' is supported by a ring-shaped lower magnet member 254', and the lower magnet member 254' can be linearly moved in upward and downward directions by linear driving units 257'.

As shown in FIG. 9, when the linear driving units 257' move the lower magnet member 254' downward, the supporting plate 251' is moved downward by an elastic repulsive force exerted by the elastic members 256' disposed between the vacuum plate 212' and the supporting plate 251'. In this state, a substrate W is loaded on the vacuum plate 212', and a negative pressure is formed at the bottom side of the substrate W by the exhaust member 335 of the back nozzle assembly 330 so that the substrate W can be vacuum-attached. Thereafter, the polishing head 420 (described later in detail) is moved toward the top side of the substrate W, and a polishing process is performed using the polishing pad 423 mounted on the polishing head 420.

After the polishing process, a post-cleaning process is performed on the top and bottom surfaces of the substrate W. For this, as shown in FIG. 10, the linear driving units 257' move the lower magnet member 254' upward. Then, the supporting plate 251' is moved upward by a magnetic repulsive force acting between the upper and lower magnets 252' and 253'. As the supporting plate 251' is moved upward, the pressing members 215' press the horizontal parts 216'b of the chucking rods 216' to rotate the vertical parts 216'a of the chucking rods 216' inwardly so that the edge of the substrate W can be supported by the vertical parts 216'a of the chucking rods 216'. At this time, the supporting pins 214' support the bottom surface of the substrate W. In this state, the cleaning unit 310 supplies cleaning liquid to the top surface of the substrate W, and the cleaning unit 320 applies supersonic waves to the cleaning liquid supplied to the top surface of the substrate W, so as to clean the top surface of the substrate W. At the same time, the cleaning liquid supply member 332 of the back nozzle assembly 330 supplies cleaning liquid to the bottom surface of the substrate W to clean the bottom surface of the substrate W.

Next, the polishing unit 400 configured to polish a substrate fixed by the above-described substrate supporting unit will be described.

Figure 11:
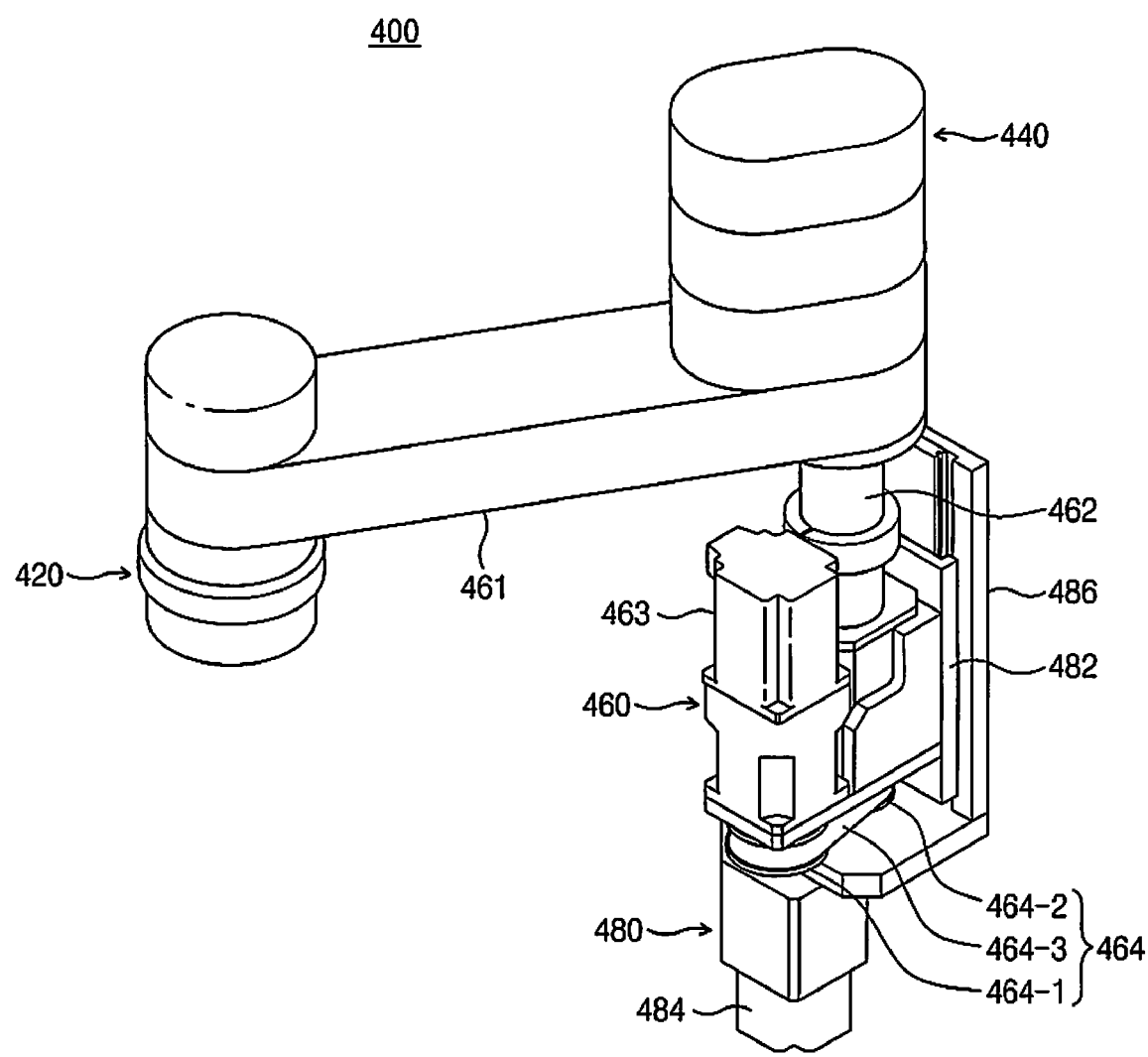
FIG. 11 is a perspective view illustrating a polishing unit of FIG. 1.
Figure 12:
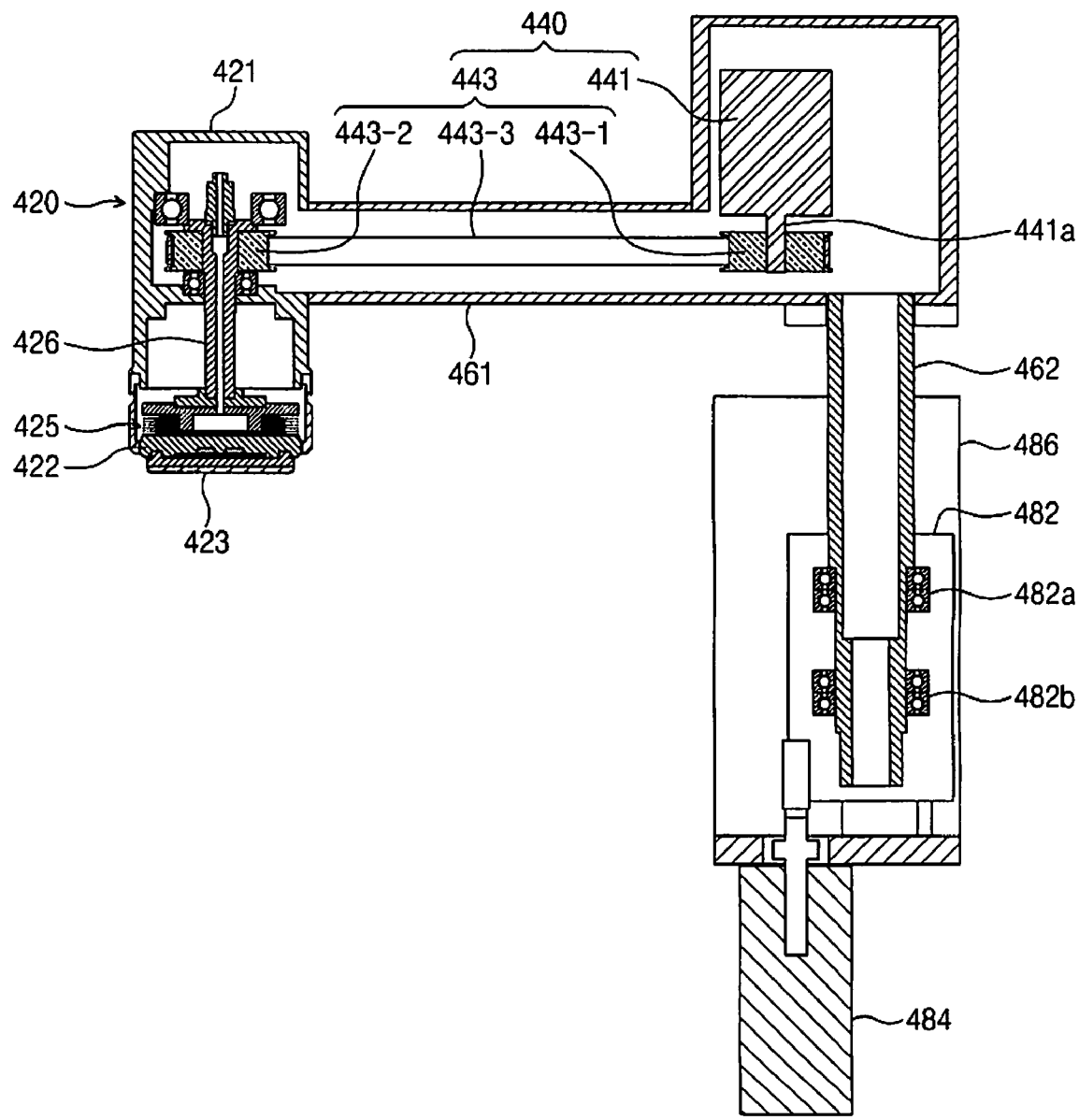
FIG. 12 is a side sectional view illustrating the polishing unit of FIG. 11.
Figure 13:
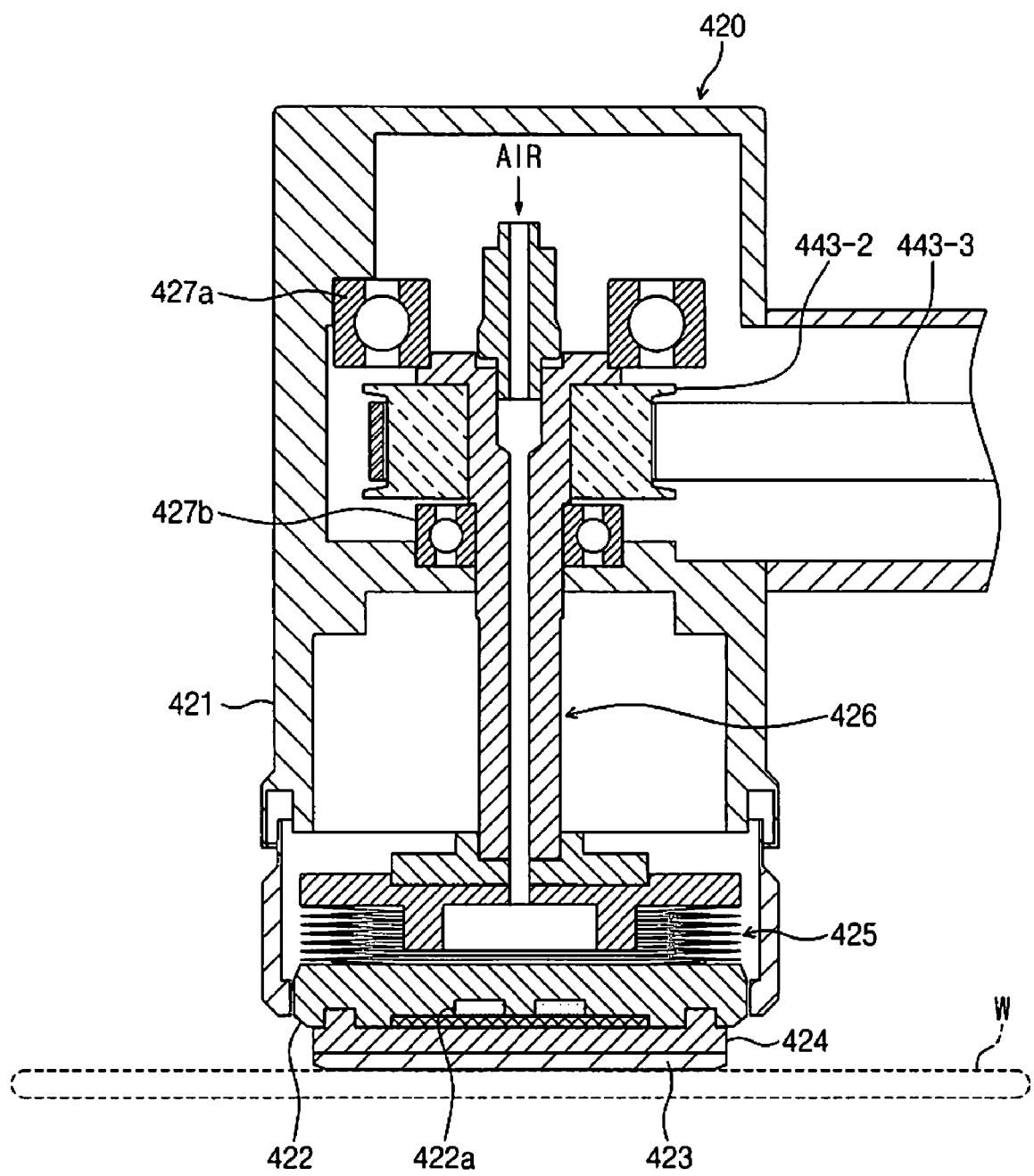
FIG. 13 is an enlarged view illustrating a polishing head of FIG. 12.

FIG. 11 is a perspective view illustrating the polishing unit 400 depicted in FIG. 1, FIG. 12 is a side sectional view illustrating the polishing unit 400 deposited in FIG. 11, and FIG. 13 is an enlarged view illustrating the polishing head 420 of the polishing unit 400 depicted in FIG. 12.

The polishing unit 400 is used in a polishing process for planarizing the surface of a substrate chemically and mechanically. Referring to FIGS. 11 through 13, the polishing unit 400 includes the polishing head 420 and first to third driving members 440, 460, and 480 for driving the polishing head 420 according to operation modes. The polishing pad 423 is mounted on the polishing head 420 for polishing a substrate. During a polishing process, the first driving member 440 rotates the polishing head 420 on the center of the polishing head 420. The second driving member 440 moves the polishing head 420 on a horizontal plane to swing the polishing head 420. The third driving member 480 moves the polishing head 420 upward and downward.

The polishing head 420 includes a cylindrical housing 421 having an opened bottom side. A plate-shaped polishing pad holder 422 is disposed at the opened bottom side of the housing 421, and the polishing pad 423 is coupled to the bottom surface of the polishing pad holder 422. The polishing pad 423 may be attached to a side of a metal plate 424, and a magnet member 422a may be mounted in the polishing pad holder 422 to apply a magnetic force to the metal plate 424 for detachably attaching the other side of the metal plate 424 to the polishing pad holder 422.

A bellows 425 is disposed on the top surface of the polishing pad holder 422. The bellows 425 can be vertically extended by an air pressure applied from a pneumatic member 426. The bellows 425 can be extended to bring the polishing pad 423 into tight contact with a substrate W during a polishing process. If a polishing process is performed in a state where the polishing pad 423 is in tight contact with the surface of a substrate W, the surface of the substrate W can be polished more uniformly and efficiently.

The pneumatic member 426 is connected to an upper portion of the bellows 425 and may be composed of a hollow shaft-shaped member. The longitudinal axis of the pneumatic member 426 may be vertically aligned. The pneumatic member 426 is rotatably supported by bearings 427a and 427b. An air supply line (not shown) is connected to the pneumatic member 426 to supply air to the pneumatic member 426. A valve (not shown) may be installed at the air supply line to close and open the air supply line, and a flow meter (not shown) may be installed at the air supply line to control the flow rate of air supplied through the air supply line. The structures of such devices are well known to one of ordinary skill in the related art, and thus detailed descriptions thereof will be omitted.

During a polishing process, the first driving member 440 rotates the polishing pad 423 on the center of the polishing pad 423. The first driving member 440 includes a first driving motor 441 providing rotation power, and a first belt-pulley assembly 443 configured to transmit rotation power from the first driving motor 441 to the polishing pad 423. The first belt-pulley assembly 443 may include a first driving pulley 443-1, a first driven pulley 443-2, and a first belt 443-3. The first driving pulley 443-1 is disposed at a rotation shaft 411a of the first driving motor 441. The first driven pulley 443-2 is disposed at an outer side of the hollow shaft-shaped pneumatic member 426. The first belt 443-3 is wound around the first driving pulley 443-1 and the first driven pulley 443-2. The first driving motor 441 at which the first driving pulley 443-1 is disposed may be disposed in an end portion of a swing arm 461 (described later) of the second driving member 460, and the first belt 443-3 may be wound around the first driving pulley 443-1 and the first driven pulley 443-2 through the inside of the swing arm 461 in the longitudinal direction of the swing arm 461.

Figure 14A:
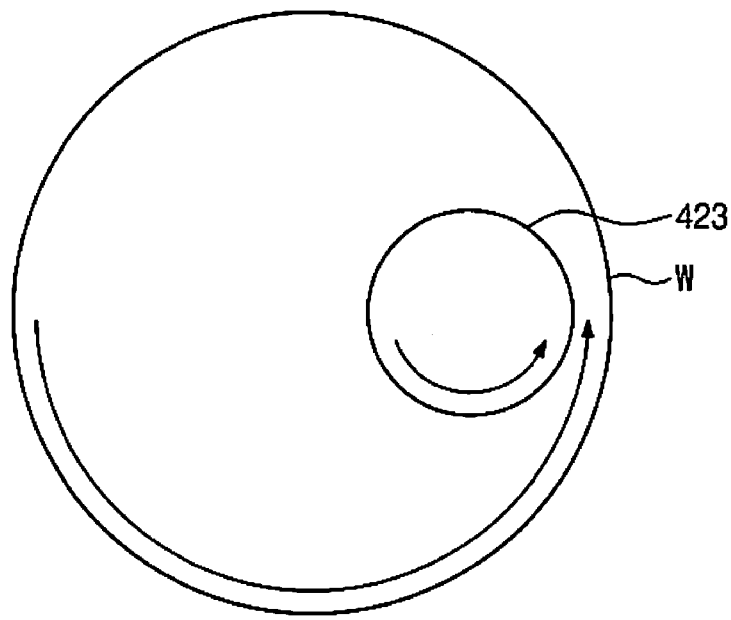
FIGS. 14A and 14B are view for illustrating an exemplary polishing process using a polishing pad.
Figure 14B:
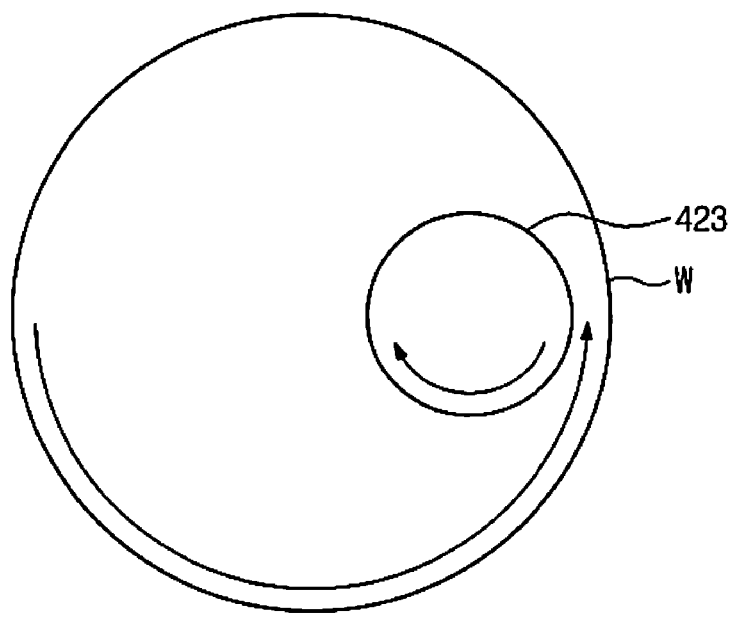

The rotation power of the first driving motor 441 is transmitted to the pneumatic member 426 through the first belt-pulley assembly 443 to rotate the pneumatic member 426, and as the pneumatic member 426 is rotated, the bellows 425, the polishing pad holder 422, and the polishing pad 423 that are sequentially assembled under the pneumatic member 426 are rotated. At this time, the first driving motor 441 of the first driving member 440 may rotate clockwise or counterclockwise. That is, the polishing pad 423 can be rotated clockwise or counterclockwise as shown in FIGS. 14A and 14B. Since the rotation direction of the polishing pad 423 can be varied between clockwise and counterclockwise, a substrate W can be polished while rotating the polishing pad 423 in the same direction as the rotation direction of the substrate W or in the opposite direction to the rotation direction of the substrate W.

The second driving member 460 is used to move the polishing head 420 on a horizontal plane to swing the polishing head 420 on the substrate W. The second driving member 460 includes the swing arm 461, a vertical arm 462, a second driving motor 463, and a second belt-pulley assembly 464. An end of the swing arm 461 is horizontally coupled to a side of the housing 421 of the polishing head 420, and the vertical arm 462 is vertically coupled to the other end of the swing arm 461 from the bottom side of the swing arm 461. The second driving motor 463 provides rotation power to the vertical arm 462 through the second belt-pulley assembly 464. The second belt-pulley assembly 464 may include a second driving pulley 464-1, a second driven pulley 464-2, and a second belt 464-3. The second driving pulley 464-1 is disposed at a rotation shaft of the second driving motor 463. The second driven pulley 464-2 is disposed at an outer side of the vertical arm 462. The second belt 464-3 is wound around the second driving pulley 464-1 and the second driven pulley 464-2.

The rotation power of the second driving motor 463 is transmitted to the vertical arm 462 through the second belt-pulley assembly 464 to rotate the vertical arm 462 on the center of the vertical arm 462, and as the vertical arm 462 is rotated, the swing arm 461 is swung about the vertical arm 462. Thus, the polishing head 420 on which the polishing pad 423 is mounted is moved along a circularly curved path.

The third driving member 480 is used to move the polishing head 420 upward and downward. The third driving member 480 includes a supporting block 482, a guide member 484, and a linear driving unit 486. The supporting block 482 supports the vertical arm 462, and the vertical arm 462 is rotatably supported by bearings 482a and 482b. The linear driving unit 486 provides driving power for linearly moving the supporting block 482 upward and downward. A linear driving member such as a cylinder member or a linear motor may be used as the linear driving unit 486. The guide member 484 guides linear movements of the supporting block 482.

The linear driving power of the linear driving unit 486 is transmitted to the supporting block 482 to move the supporting block 482 together with the vertical arm 462 supported by the supporting block 482 in upward and downward directions. As the vertical arm 462 is moved upward and downward, the polishing head 420 on which the polishing pad 423 is mounted is moved upward and downward.

In the case of a polishing process is repeatedly performed using the polishing pad 423, the surface of the polishing pad 423 should be periodically polished to adjust the surface roughness of the polishing pad 423. For this, as shown in FIG. 1, the pad conditioning unit 500 is provided in the process chamber 10 at a position close to the polishing unit 400.

Figure 15:
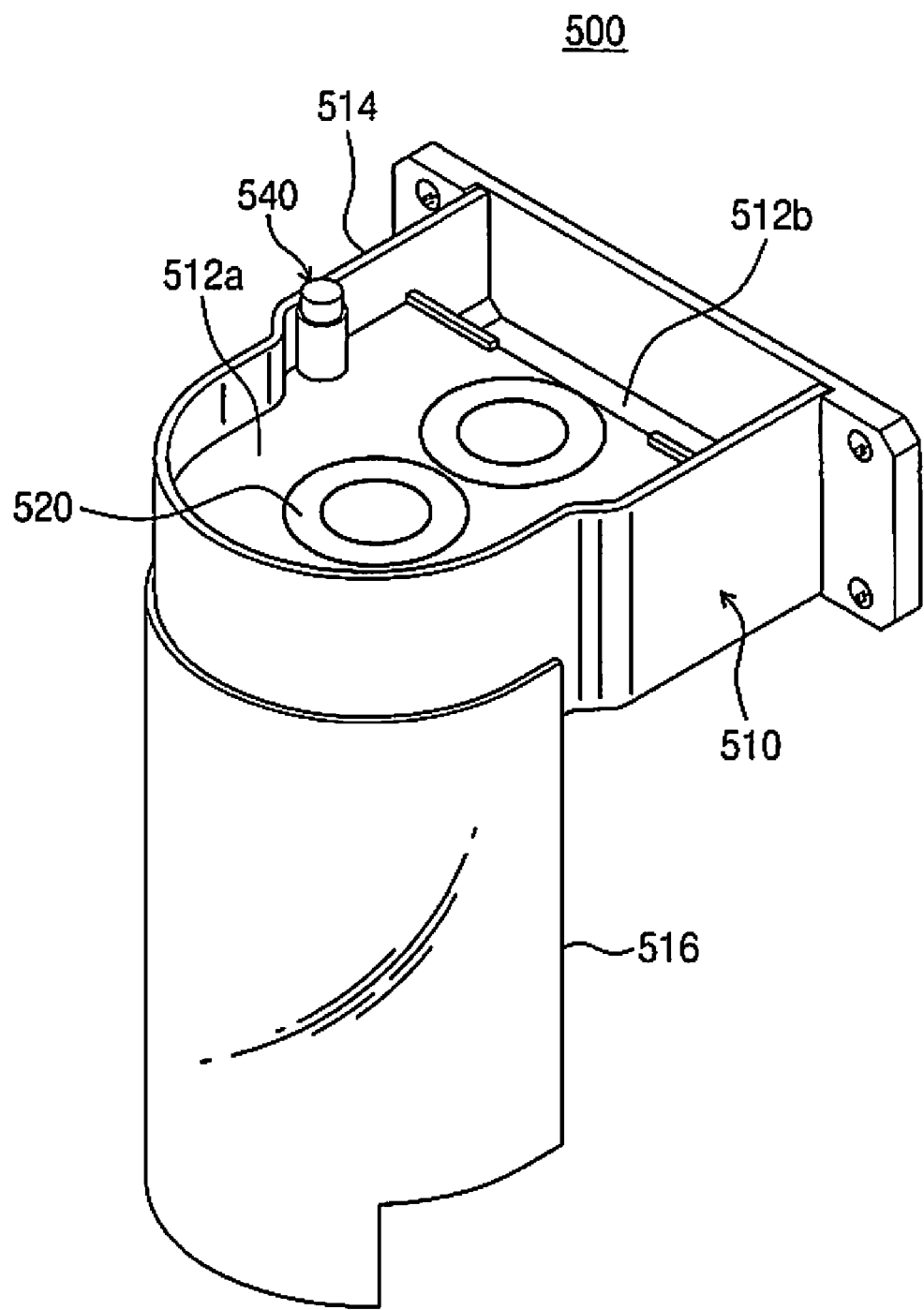
FIG. 15 is a perspective view illustrating a pad conditioning unit of FIG. 1.
Figure 16:
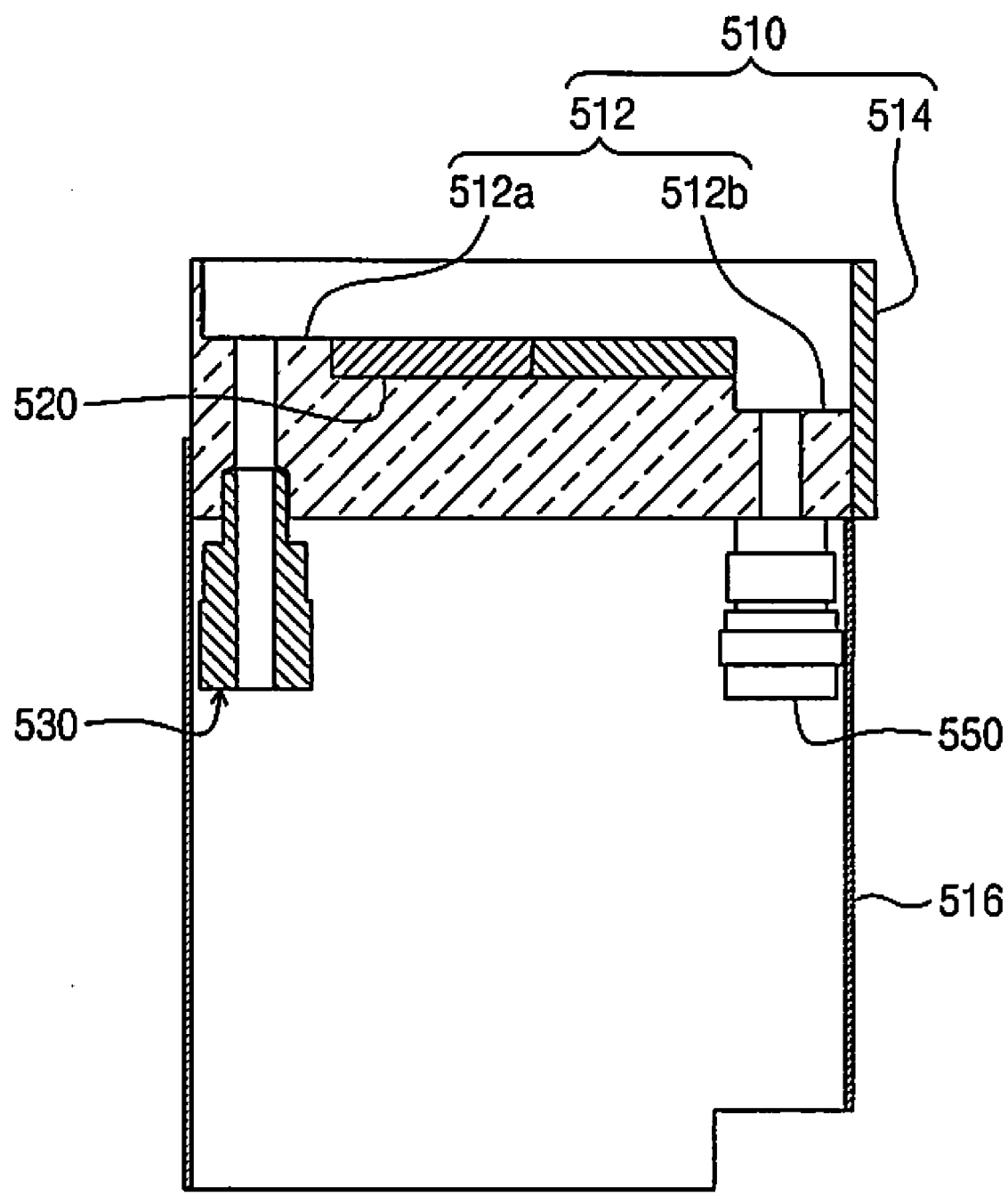
FIG. 16 is a side sectional view illustrating the pad conditioning unit of FIG. 15.
Figure 17:
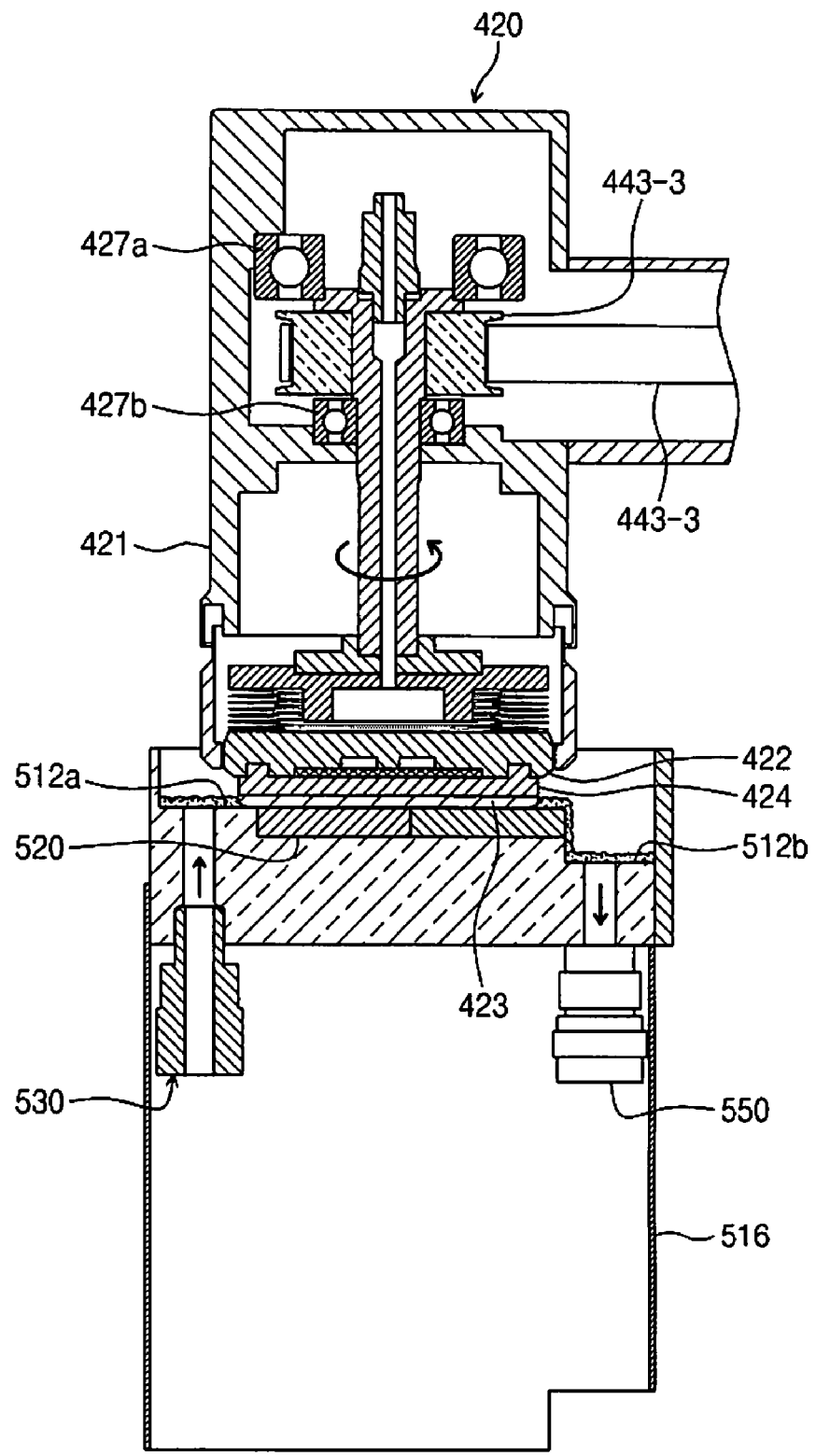
FIG. 17 is a sectional view for illustrating an operational state of the pad conditioning unit.
Figure 18:
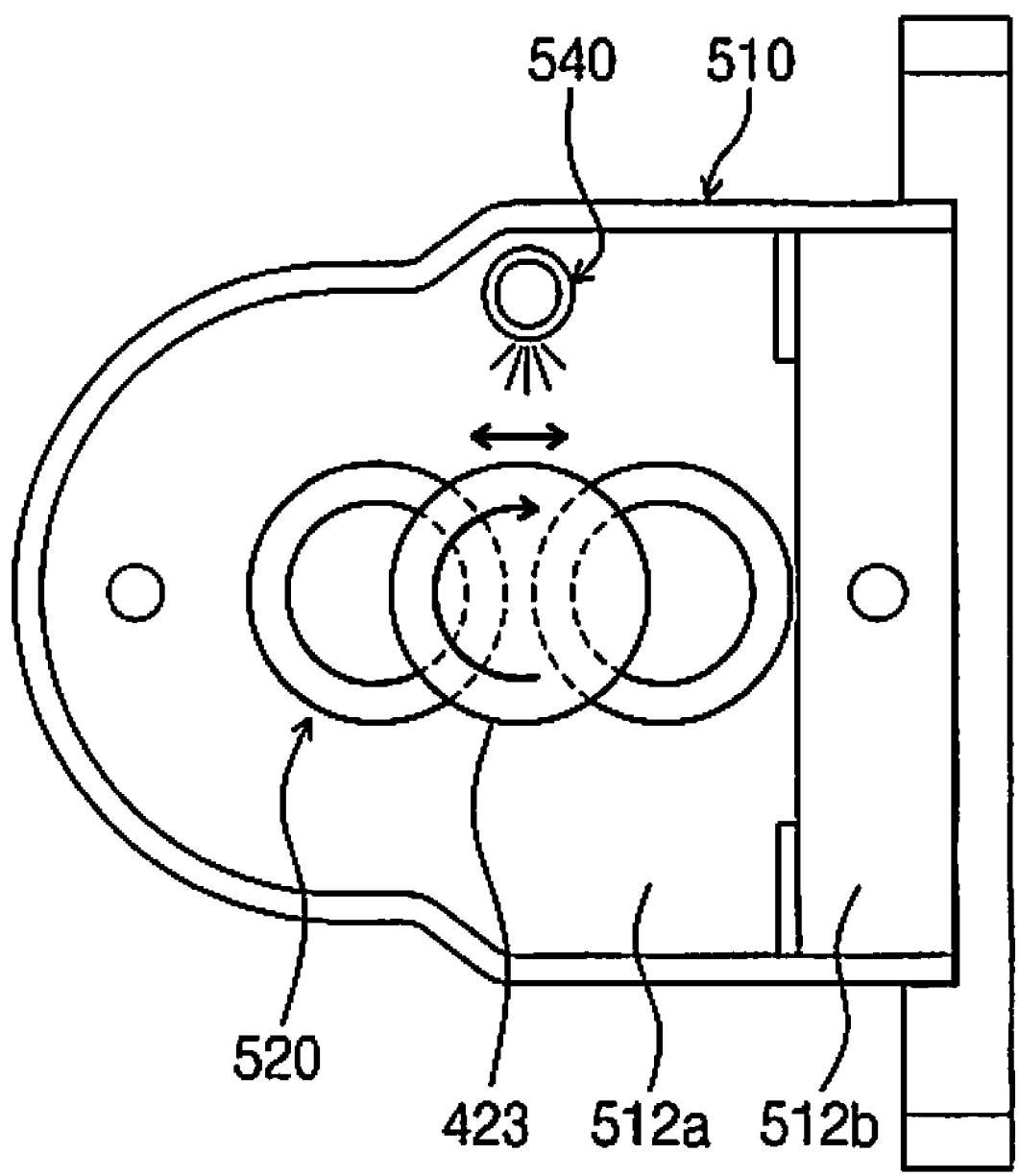
FIG. 18 is a plan view for illustrating an operational state of the pad conditioning unit.

FIG. 15 is a perspective view illustrating the pad conditioning unit 500 depicted in FIG. 1, and FIG. 16 is a side sectional view illustrating the pad conditioning unit 500 depicted in FIG. 15. FIGS. 17 and 18 are views for illustrating an operational state of the pad conditioning unit 500.

Referring to FIGS. 15 through 18, the pad conditioning unit 500 includes a process tub 510 having a bucket shape with an opened top for receiving an end of the polishing head 420 on which the polishing pad 423 is mounted. The process tub 510 includes a bottom wall 512 and a sidewall 514 extending upward from the edge of the bottom wall 512, and a supporting frame 516 is disposed at the bottom side of the bottom wall 512. The bottom wall 512 of the process tub 510 may include a first bottom wall 512a having a first height and a second bottom wall 512b having a second height lower than the first height.

A diamond conditioner 520 is disposed at the first bottom wall 512a of the process tub 510. The diamond conditioner 520 makes contact with the polishing pad 423 for polishing the surface of the polishing pad 423. The diamond conditioner 520 may have a ring or circular shape. The diamond conditioner 520 may have a size corresponding to the size of the first bottom wall 512a. Alternatively, a plurality of diamond conditioners 520 each smaller than the first bottom wall 512a may be provided.

First and second deionized water supply members 530 and 540 are disposed at the process tub 510 to supply deionized water to the first bottom wall 512a of the process tub 510 for removing particles generated while the polishing pad 423 is being polished. The first deionized water supply member 530 is connected to the first bottom wall 512a to supply deionized water to the inside of the process tub 510 through the first bottom wall 512a, and the second deionized water supply member 540 is disposed at a side of the process tub 510 to supply deionized water to the first bottom wall 512a from the upper side of the first bottom wall 512a. Deionized water, which is supplied from the first and second deionized water supply members 530 and 540, removes particles while flowing along the first bottom wall 512a, and then the particle-containing deionized water flows to the second bottom wall 512b lower than the first bottom wall 512a. The particle-containing deionized water is discharged from the second bottom wall 512b through a drain member 550 connected to the second bottom wall 512b.

As shown in FIG. 17, the polishing pad 423 is polished in a state where an end of the polishing head 420 is placed in the process tub 510. At this time the third driving member 480 (refer to FIG. 11) moves the polishing head 420 placed in the process tub 510 upward and downward to bring the polishing pad 423 into contact with the diamond conditioner 520. In this state, as shown in FIG. 18, the first driving member 440 (refer to FIG. 11) rotates the polishing pad 423, and the second driving member 460 (refer to FIG. 11) moves the polishing pad 423 on a horizontal plane for scanning (moving) the polishing pad 423 on the diamond conditioner 520. At this time, the first and second deionized water supply members 530 and 540 supply deionized water to the process tub 510 to remove particles generated while the polishing pad 423 is polished, and then the deionized water is discharged to the outside through the drain member 550.

According to the present invention, in a state where a substrate is supported by the single type substrate supporting unit, a process for polishing the top surface of the substrate and a post-process for cleaning the top and bottom surfaces of the substrate can be sequentially performed.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate supporting unit comprising:
   a vacuum plate to which a substrate is attached by vacuum suction;
   a supporting plate disposed under the vacuum plate at a predetermined distance from the vacuum plate, and at which chucking members are disposed to clamp the substrate; and
   a driving member configured to move the vacuum plate or the supporting plate to vary the predetermined distance so as to allow the chucking members to support the substrate in a state where the substrate is spaced from the supporting plate.

2. The substrate supporting unit of claim 1, wherein the driving member comprises:
   upper and lower magnet members vertically arranged under the supporting plate to face each other, the upper and lower magnet members being oriented with opposing poles thereof facing each other such that a magnetic repulsive force acts between the upper and lower magnet members;
   connection members each having a first end connected to the vacuum plate and a second end connected to the upper magnet member; and
   a linear driving unit configured to move the lower magnet member upward and downward.

3. The substrate supporting unit of claim 2, wherein each of the upper and lower magnet members has a ring shape.

4. The substrate supporting unit of claim 2, wherein the connection members have a bar shape and are inserted in holes formed through the supporting plate.

5. The substrate supporting unit of claim 2, further comprising an elastic member configured to exert an elastic repulsive force between the supporting plate and the upper magnet member.

6. The substrate supporting unit of claim 2, further comprising a sensing member configured to detect whether the lower magnet member is vertically moved to a preset height.

7. The substrate supporting unit of claim 2, wherein the chucking members comprise:
   supporting pins configured to support a bottom surface of the substrate; and
   chucking pins configured to support an edge of the substrate,
   wherein holes are formed through the vacuum plate for receiving the supporting pins and the chucking pins when the supporting plate is moved upward and downward.

8. The substrate supporting unit of claim 2, wherein a detachment preventing jaw protrudes from an edge portion of the vacuum plate to prevent detachment of the substrate attached to the vacuum plate by vacuum suction.

9. The substrate supporting unit of claim 2, wherein a buffer member formed of an elastic material is disposed on a top surface of the vacuum plate to prevent the substrate attached to the vacuum plate by vacuum suction from being deformed by a foreign substance existing between the substrate and the vacuum plate.

10. The substrate supporting unit of claim 1, wherein the driving member comprises:
an upper magnet member disposed at the supporting plate;
a lower magnet member disposed under the upper magnet member to face the upper magnet member, poles of the lower magnet member being oriented such that a magnetic repulsive force acts between the upper and lower magnet members; and
a linear driving unit configured to move the lower magnet member upward and downward.

11. The substrate supporting unit of claim 10, wherein the chucking members comprise:
supporting pins configured to support a bottom surface of the substrate; and
L-shaped chucking rods rotatably disposed outside the supporting pins for supporting an edge of the substrate,
wherein holes are formed through the vacuum plate for receiving the supporting pins when the supporting plate is moved upward and downward.

12. The substrate supporting unit of claim 11, wherein a pressing member protrudes from a bottom surface of the vacuum plate, and
when the supporting plate is moved upward, the pressing member presses horizontal parts of the L-shaped chucking rods to rotate the chucking rods such that vertical parts of the rotated chucking rods support the edge of the substrate.

13. The substrate supporting unit of claim 10, further comprising a guide member disposed at a rotation shaft connected to a bottom surface of the vacuum plate for guiding upward and downward movements of the supporting plate.

14. The substrate supporting unit of claim 10, further comprising an elastic member configured to exert an elastic repulsive force between the vacuum plate and the supporting plate.

15. A single type substrate polishing apparatus comprising:
a process chamber;
a substrate supporting unit disposed in the process chamber for supporting a substrate;
a polishing unit configured to polish the substrate; and
a cleaning unit configured to clean the polished substrate,
wherein the substrate supporting unit comprises:
a vacuum plate to which the substrate is attached by vacuum suction;
a supporting plate disposed under the vacuum plate at a predetermined distance from the vacuum plate, and at which chucking members are disposed to clamp the substrate; and
a driving member configured to move the vacuum plate or the supporting plate to vary the predetermined distance so as to allow the chucking members to support the substrate in a state where the substrate is spaced from the supporting plate.

16. The single type substrate polishing apparatus of claim 15, wherein the driving member comprises:
upper and lower magnet members vertically arranged under the supporting plate to face each other, the upper and lower magnet members being oriented with opposing poles thereof facing each other such that a magnetic repulsive force acts between the upper and lower magnet members;
connection members each having a first end connected to the vacuum plate and a second end connected to the upper magnet member; and
a linear driving unit configured to move the lower magnet member upward and downward.

17. The single type substrate polishing apparatus of claim 16, wherein the chucking members comprise:
supporting pins configured to support a bottom surface of the substrate; and
chucking pins configured to support an edge of the substrate,
wherein holes are formed through the vacuum plate for receiving the supporting pins and the chucking pins when the supporting plate is moved upward and downward.

18. The single type substrate polishing apparatus of claim 16, wherein the connection members have a bar shape and are inserted in holes formed through the supporting plate, and
coil shaped elastic members are disposed around the bar-shaped connection members between the supporting plate and the upper magnet member.

19. The single type substrate polishing apparatus of claim 16, further comprising a sensing member configured to detect whether the lower magnet member is vertically moved to a preset height.

20. The single type substrate polishing apparatus of claim 16, wherein a detachment preventing jaw protrudes from an edge portion of the vacuum plate to prevent detachment of the substrate attached to the vacuum plate by vacuum suction, and
a buffer member formed of an elastic material is disposed on a top surface of the vacuum plate to prevent the substrate attached to the vacuum plate by vacuum suction from being deformed by a foreign substance existing between the substrate and the vacuum plate.

21. The single type substrate polishing apparatus of claim 16, wherein the cleaning unit comprises:
a first cleaning unit disposed at a side of the substrate supporting unit for cleaning a top surface of the substrate; and
a second cleaning unit disposed at a top center portion of the supporting plate for supplying a cleaning liquid to a bottom surface of the substrate,
wherein an opening is formed through a center portion of the vacuum plate to allow supply of the cleaning liquid from the second cleaning unit to the bottom surface of the substrate.

22. The single type substrate polishing apparatus of claim 15, wherein the driving member comprises:
an upper magnet member disposed at the supporting plate;
a lower magnet member disposed under the upper magnet member to face the upper magnet member, poles of the lower magnet member being oriented such that a magnetic repulsive force acts between the upper and lower magnet members; and
a linear driving unit configured to move the lower magnet member upward and downward.

23. The single type substrate polishing apparatus of claim 22, wherein the chucking members comprise:
supporting pins configured to support a bottom surface of the substrate; and
L-shaped chucking rods rotatably disposed outside the supporting pins for supporting an edge of the substrate, wherein holes are formed through the vacuum plate for receiving the supporting pins when the supporting plate is moved upward and downward.

24. The single type substrate polishing apparatus of claim 23, wherein a pressing member protrudes from a bottom surface of the vacuum plate, and
when the supporting plate is moved upward, the pressing member presses horizontal parts of the L-shaped chucking rods to rotate the chucking rods such that vertical parts of the rotated chucking rods support the edge of the substrate.

25. The single type substrate polishing apparatus of claim 22, wherein further comprising a guide member disposed at a rotation shaft supporting the vacuum plate for guiding upward and downward movements of the supporting plate.

26. The single type substrate polishing apparatus of claim 22, further comprising an elastic member configured to exert an elastic repulsive force between the vacuum plate and the supporting plate.

27. The single type substrate polishing apparatus of claim 22, wherein the cleaning unit comprises:
a first cleaning unit disposed at a side of the substrate supporting unit for cleaning a top surface of the substrate; and
a second cleaning unit disposed at the vacuum plate for supplying a cleaning liquid to a bottom surface of the substrate.

* * * * *